United States Patent
Kaneko

(10) Patent No.: US 7,859,021 B2
(45) Date of Patent: Dec. 28, 2010

(54) FIELD-EFFECT SEMICONDUCTOR DEVICE

(75) Inventor: Nobuo Kaneko, Saitama (JP)

(73) Assignee: Sanken Electric Co., Ltd. (JP)

( * ) Notice: Subject to any disclaimer, the term of this patent is extended or adjusted under 35 U.S.C. 154(b) by 0 days.

(21) Appl. No.: 12/199,323

(22) Filed: Aug. 27, 2008

(65) Prior Publication Data
US 2009/0057720 A1   Mar. 5, 2009

(30) Foreign Application Priority Data

Aug. 29, 2007  (JP) .............................. 2007-222273
Mar. 21, 2008  (JP) .............................. 2008-073603

(51) Int. Cl.
*H01L 29/66*   (2006.01)
(52) U.S. Cl. ..................... 257/194; 257/197; 257/205; 257/273; 257/361; 257/E29.246
(58) Field of Classification Search ................ 257/194, 257/197, 205, 273, 361, E29.246
See application file for complete search history.

(56) References Cited

U.S. PATENT DOCUMENTS 5,276,340 A * 1/1994 Yokoyama et al. .......... 257/194

7,449,762 B1 * 11/2008 Singh ......................... 257/493

FOREIGN PATENT DOCUMENTS

| JP | 2004-273486 A | 9/2004 |
| JP | 2006-222414 A | 8/2006 |
| WO | WO03/071607 A1 | 8/2003 |

* cited by examiner

*Primary Examiner*—Tan N Tran
(74) *Attorney, Agent, or Firm*—Woodcock Washburn LLP

(57) ABSTRACT

A HEMT-type field-effect semiconductor device has a main semiconductor region comprising two layers of dissimilar materials such that a two-dimensional electron gas layer is generated along the heterojunction between the two layers. A source and a drain electrode are placed in spaced positions on a major surface of the main semiconductor region. Between these electrodes, a gate electrode is received in a recess in the major surface of the main semiconductor region via a p-type metal oxide semiconductor film whereby a depletion zone is normally created in the electron gas layer, with a minimum of turn-on resistance and gate leak current.

18 Claims, 7 Drawing Sheets

FIELD-EFFECT SEMICONDUCTOR DEVICE

CROSS REFERENCE TO RELATED APPLICATIONS

This application claims priority to Japanese Patent Application No. 2007-222273, filed Aug. 29, 2007, and Japanese Patent Application No. 2008-073603 filed Mar. 21, 2008.

BACKGROUND OF THE INVENTION

This invention relates to semiconductor devices, particularly to field-effect semiconductor devices as typified by the high electron mobility transistor (HEMT), the two-dimensional electron gas (2DEG) diode (diode that utilizes a layer of 2DEG as a current path or channel), and the metal-semiconductor field-effect transistor (MESFET). More particularly, the invention pertains to such field-effect semiconductor devices that are normally off, instead of normally on as in the case of most of such devices known heretofore. The invention also deals with a method of fabricating such normally-off field-effect semiconductor devices.

The HEMT has been known and used extensively which comprises an electron transit layer of undoped semiconducting nitride such as gallium nitride (GaN) grown on a substrate of silicon or sapphire via a buffer, and an electron supply or barrier layer of n-doped or undoped semiconducting nitride such as aluminum gallium nitride (AlGaN) deposited on the electron transit layer. A source, a drain and a gate (Schottky) electrode are disposed on the electron supply layer.

Made from the dissimilar semiconducting materials, the electron transit layer and electron supply layer differ in both band gap and lattice constant. The electron supply layer of AlGaN is greater in bandgap, and less in lattice constant, than the electron transit layer of GaN or the like. By being placed on the electron transit layer having a greater lattice constant, the electron supply layer generates an expansive strain or tensile stress and so undergoes piezoelectric depolarization. The electron supply layer is additionally subject to spontaneous depolarization.

Consequently, due to both piezoelectric and spontaneous depolarizations, the 2DEG layer is created along the heterojunction between the electron supply layer and the electron transit layer. The 2DEG layer provides a channel of very low resistance, or of high electron mobility, for source-drain current flow. This current flow is controllable by a bias voltage applied to the gate electrode.

As heretofore constructed, the HEMTs of the general construction above were mostly normally on; that is, there was a source-drain flow of electrons while no voltage was applied to the gate. The normally-on HEMT had to be turned off using a negative power supply for causing the gate electrode to gain a negative potential. Use of such a negative power supply made the associated circuitry unnecessary complex and expensive. The conventional normally-on HEMTs were rather inconvenient of use.

Attempts have been made to render the HEMT normally off. Among the suggestions heretofore made to this end are:

1. Accommodating the gate in a recess formed in the electron supply layer.
2. Interposing a p-type nitride semiconductor layer between the gate and the electron supply layer (Japanese Unexamined Patent Publication No. 2004-273486).
3. Accommodating the gate in a recess in the electron supply layer via an insulating film of strontium titanate or the like (Japanese Unexamined Patent Publication No. 2006-222414).
4. Partly removing the electron supply layer to expose part of the electron transit layer and placing the gate on the exposed part of the electron transit layer via an insulating film (WO 2003/071607).

The first cited known scheme is designed to weaken the electric field due to the piezoelectric and spontaneous depolarizations adjacent the part of the electron supply layer that has become thin by creation of the recess therein. The weaker electric field is cancelled out by the built-in potential of the device, that is, the potential difference between the gate and the electron supply layer when no bias voltage is being applied to the gate. The result is the disappearance of the 2DEG layer from the neighborhood of the gate. The device is normally off because there is no source-drain current flow while no voltage is being applied to the gate.

However, the HEMT built on this known scheme had a threshold voltage as low as one volt or even less and so was easy to be triggered into action by noise. What was worse, this threshold changed substantively with manufacturing errors in the depth of the recess in the electron supply layer. Another weakness was that there was a relatively large current leakage upon application of a positive voltage to the Schottky gate. Creating the recess in the electron supply layer brought about an additional shortcoming that the resulting thin part of the electron supply layer became incapable of supplying a sufficient amount of electrons to the electron transit layer even when a voltage was applied to the gate in order to turn the device on. The fact that the 2DEG layer was partly insufficient in electron density the turn-on resistance of the device inordinately high.

The provision of the p-type semiconductor layer under the gate according to the second known suggestion above serves to raise the potential of the underlying part of the electron transit layer. The resulting depletion of electrons from under the gate creates a hiatus in the 2DEG layer, making the device normally off.

An objection to this second known suggestion is the difficulty of creating the p-type nitride semiconductor layer of the sufficiently high hole density required. In cases where this requirement was not met, then it became necessary either to make the electron supply layer thinner or, if the electron supply layer was made from AlGaN or aluminum indium gallium nitride (AlInGaN), to lower its aluminum content. The result in either case was a drop in the electron density of the 2DEG layer, which in turn made higher the source-drain turn-on resistance.

The third known solution also seeks to gain normally-off performance by making the electron supply layer thinner under the gate by creating a recess in that layer. By receiving the gate in this recess via the insulating film, the HEMT is saved from an increase in current leakage and made higher in transconductance (symbol $g_m$).

Having a recess in the electron supply layer, this prior art normally-off HEMT possesses the same shortcomings as the first described one. As an additional disadvantage, the insulating film was susceptible to physical defects, particularly when made thinner for a higher transconductance. A defective insulating film was a frequent cause of current leakage, lower antivoltage strength, device destruction, and current collapse. All these results would be avoidable by making the insulating film thicker, but then the device would be inconveniently low in transconductance.

With the gate placed on the exposed part of the electron transit layer via an insulating film as in the fourth known solution above, the 2DEG layer in the electron transit layer is normally absent from under the gate. A problem with this prior art device arose when the gate was excited to turn it on.

Its turn-on resistance was higher than the more conventional normally-on HEMT by reason of the absence of the 2DEG layer from under the gate.

The difficulties and inconveniences pointed out hereinbefore in conjunction with the known normally-off field-effect semiconductor devices are not limited to HEMTs alone. Similar problems have attended the conventional endeavors to provide other types of normally-off field-effect semiconductor devices such as MESFETs and 2DEG diodes.

SUMMARY OF THE INVENTION

It is among the objects of this invention to render field-effect semiconductor devices of the kind defined, capable of operation in normally-off mode while keeping their turn-on resistance and gate leak current significantly less than those of the comparable prior art devices.

Another object of the invention is to provide a method of fabricating field-effect semiconductor devices that meet the requirements of the first recited object.

Briefly, the present invention may be summarized in one aspect thereof as a field-effect semiconductor device comprising a main semiconductor region having a first and a second semiconductor layer of dissimilar semiconducting materials such that a two-dimensional charge carrier (i.e., electrons or holes) gas layer is generated in the first semiconductor layer along the heterojunction between the first and the second semiconductor layer. The main semiconductor region has a first and a second opposite major surface. The second semiconductor layer is disposed between the first major surface of the main semiconductor region and the first semiconductor layer. A first and a second main electrode (e.g., source and drain electrodes) are disposed in spaced-apart positions on the first major surface (where the second semiconductor layer is exposed) of the main semiconductor region and electrically coupled to the two-dimensional carrier gas layer in the first semiconductor layer of the main semiconductor region. Between these electrodes and on the major surface of the main semiconductor region is a gate electrode for controlling conduction between the first and the second main electrode via the two-dimensional carrier gas layer. The invention particularly features a metal oxide semiconductor film disposed between the gate electrode and the main semiconductor region and having a conductivity type (e.g., p-type or n-type) such that carrier concentration in the two-dimensional carrier gas layer is reduced. Namery, the metal oxide semiconductor film has a conductivity type such that the charge carriers are sent away from under the semiconductor film, with the consequent creation of a depletion zone in the two-dimensional carrier gas layer.

The principles of the invention are applied to HEMTs, or HEMT-type devices to be more exact, in most of the embodiments disclosed subsequently. In the case of a HEMT the first and the second semiconductor layer of the main semiconductor region take the form of an electron transit layer and electron supply layer, respectively. The gate electrode controls conduction between a source and a drain electrode via the 2DEG layer in the electron transit layer. Underlying the gate electrode, the metal oxide semiconductor layer of p-type conductivity is effective to introduce a break in the 2DEG layer as well as to reduce gate leak current during HEMT operation. Preferably, a recess, itself conventional in the art, is formed in the major surface of the main semiconductor region, and the gate electrode is received in this recess via the p-type metal oxide semiconductor layer.

The metal oxide semiconductor film is easy of fabrication and chemically stable as well. Endowed with a required conductivity type, the metal oxide semiconductor layer functions to deplete the charge carriers at the underlying part of the two-dimensional carrier gas layer, positively holding the device normally off by reason of the depletion zone thus created in the two-dimensional carrier gas layer.

An additional advantage of the metal oxide semiconductor film is the ease with which its population of charge carriers (e.g., holes) is enhanced. The metal oxide semiconductor film of higher carrier density is more effective for depletion of the charge carriers from the neighboring part of the two-dimensional carrier gas layer.

In a preferred embodiment of the invention the metal oxide semiconductor layer is made from nickel oxide. Particularly when combined with a gate electrode in the form of a lamination of a nickel and a gold layer, the nickel oxide film can greatly lessen gate leak current.

In another embodiment the main semiconductor region has a third semiconductor layer which, in the case of a HEMT, is a second electron supply layer on the first electron supply layer which in turn overlies the electron transit layer. The second electron supply layer has a higher density of electrons than the first electron supply layer. The recess is formed in the second electron supply layer, so that the first electron supply layer of relatively low electron density intervenes between this recess and the electron transit layer. Consequently, even though the recess may fluctuate in depth by manufacturing errors, there will not be proportionately large fluctuations in the threshold voltage of the device. The threshold voltage would vary much more greatly with the depth of the recess if only the electron supply layer of higher electron density were present between the recess and the electron transit layer.

There is an additional benefit offered by the second electron supply layer of higher electron density than that of the first electron supply layer: Despite the presence of the first electron supply layer of relatively low electron density, the 2DEG layer in the electron transit layer can be made higher in electron density at other than under the recess, thereby lowering the turn-on resistance of the device.

If the main semiconductor region has three semiconductor layers as above, it is preferred that the first semiconductor layer (e.g., electron transit layer) be of a nitride semiconductor, the second semiconductor layer (e.g., first electron supply layer) of a nitride semiconductor containing aluminum, and the third semiconductor layer (e.g., second electron supply layer) of a nitride semiconductor containing a greater proportion of aluminum than the second semiconductor layer. Being less in aluminum proportion than the third semiconductor layer, and lying next to the first semiconductor layer, the second semiconductor layer enables a device to possess a plus threshold voltage. For the same reason the threshold voltage of the device is to fluctuate less with variations in the depth of the recess. The threshold voltage would fluctuate more easily should there be only a layer of higher aluminum proportion between the recess and the first semiconductor layer.

In still another embodiment the main semiconductor region has a fourth semiconductor layer (e.g., third electron supply layer) on the third semiconductor layer. Of a nitride semiconductor with an aluminum proportion less than that of the third semiconductor layer (e.g., second electron supply layer), the fourth semiconductor layer is effective to electrically stabilize the surface of the main semiconductor region, reducing current leakage and preventing current collapse.

In a further embodiment the main semiconductor region has a fifth semiconductor layer of a nitride semiconductor with an aluminum proportion less than that of the underlying fourth semiconductor layer. Doped into a conductivity type (e.g., n-type) opposite to that of the metal oxide semiconductor film, the fifth semiconductor layer serves for better ohmic contact with the overlying two main electrodes.

The main semiconductor region may additionally comprise a spacer between the first and the second semiconductor layer, the spacer being thinner than the second semiconductor layer and containing aluminum in a higher proportion than the second semiconductor layer. The spacer functions to bar the diffusion of impurities or elements from the second into the first semiconductor layer and hence to save the two-dimensional carrier gas layer from a decline in the mobility of the charge carriers.

For surface stabilization of the main semiconductor film, an insulating film may be employed which covers at least parts of the major surface of the main semiconductor region between the first main electrode and the gate electrode and between the second main electrode and the gate electrode. Additionally, made from a silicon oxide in particular, the insulating film will develop a compressive stress of, say, $4.00 \times 10^9$ dyn/cm$^2$. Caused by this compressive stress, the piezoelectric depolarization of the second semiconductor layer of the main semiconductor region will lead to a higher density of the charge carriers (e.g., electrons) in the two-dimensional carrier gas layer (e.g., 2DEG layer). The turn-on resistance of the device will then be less than in the prior art case where a silicon nitride film, rather than the silicon oxide film above, was provided on the major surface of the main semiconductor region.

Use of a gate field plate is recommended for mitigation of field concentrations. Disposed on the major surface of the main semiconductor region via the insulating film and coupled to the gate electrode, the gate field plate will serve the additional purpose of permitting the electrons that have been trapped at the surface states of the main semiconductor region to be drawn therethrough when a high voltage is applied to the device, thereby saving the same from current collapse and preventing a rise in turn-on resistance.

The insulating film may be formed to include slanting side surfaces underlying the field plate. Field concentrations at the edges of the gate electrode will then diminish, enabling the device to withstand higher voltages.

A further embodiment is disclosed in which the gate electrode is electrically coupled to the first major electrode. The device will then operate as a high-speed diode.

Also disclosed is an embodiment where the invention is applied to a MESFET or MESFET-type device only with slight modifications of the main semiconductor region. Incorporating the p-type metal oxide semiconductor film suggested by the invention, the MESFET can be made normally off with the advantages set forth in connection with the normally-off HEMT above.

The present invention also provides a method of making the normally-off field-effect semiconductor device of the above summarized general construction. The method features the fabrication of the metal oxide semiconductor film by sputtering, preferably magnetron sputtering, in an oxygen-containing atmosphere. So made, the meal oxide semiconductor film will be rich in charge carriers.

The above and other objects, features and advantages of this invention will become more apparent, and the invention itself will best be understood, from a study of the following description and appended claims, with reference had to the attached drawings showing some preferable embodiments of the invention.

DESCRIPTION OF THE PREFERRED EMBODIMENTS

Figure 1:
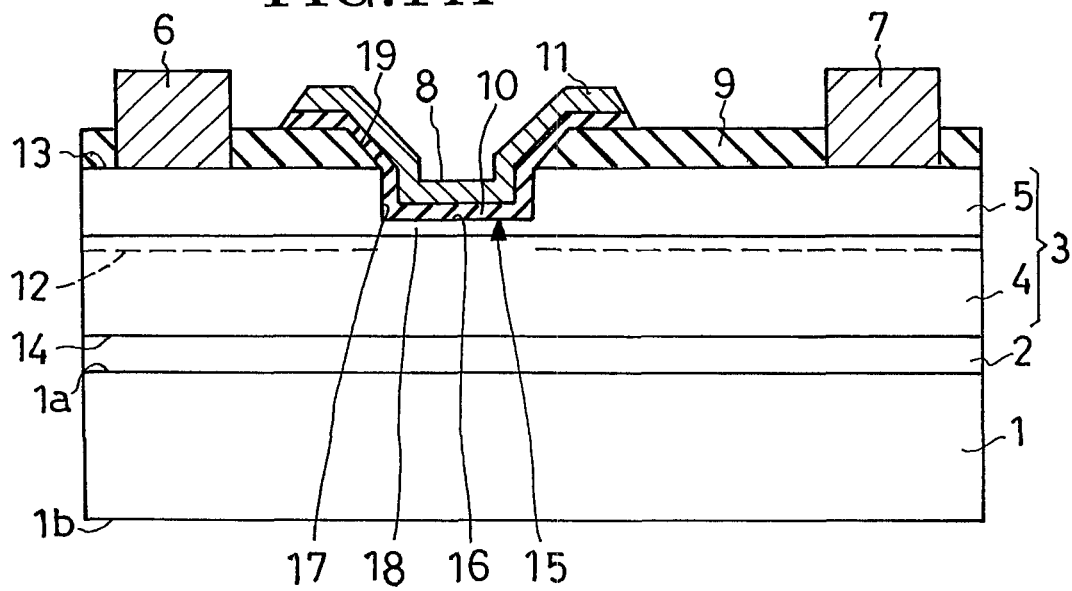
FIG. 1A is a diagrammatic, sectional illustration of the normally-off field-effect semiconductor device embodying the novel concepts of this invention.
FIG. 1B is an enlarged, fragmentary sectional view of the gate electrode of the normally-off field-effect semiconductor device.
Figure 1:
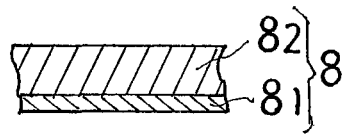

The present invention will now be described more specifically as embodied in the HEMT-type field-effect semiconductor device shown at FIG. 1A of the drawings above. The "HEMT-type field effect semiconductor device" is so named tentatively in this application because it differs in gate design from what is now generally known as the HEMT but is akin thereto in operating principle. So the device shown in FIG. 1A, as well as the additional devices to be presented subsequently, will be referred to as the "HEMT-type field-effect semiconductor device," or simply as "HEMT-type semiconductor device," or more simply as "HEMT-type device," or even more simply as "device." How the illustrated devices differ from the conventional HEMT will become apparent as the description proceeds.

The representative HEMT-type field-effect semiconductor device of FIG. 1A includes a substrate 1 of semiconducting monocrystalline silicon having a pair of opposite major surfaces $1_a$ and $1_b$. Grown on the major surface $1_a$ of the substrate 1 via a buffer 2 is a main semiconductor region 3 which is shown constituted of an electron transit layer 4 as a first semiconductor layer, and an electron supply layer 5 as a second semiconductor layer. A source electrode 6 as a first main electrode, a drain electrode 7 as a second main electrode, and a gate electrode 8, all standard HEMT components, are formed in preselected positions on the main semiconductor region 3. Additionally, there are provided on the main semiconductor region 3 a silicon oxide insulating film 9, a p-type metal oxide semiconductor film 10 constituting a feature of this invention, and a gate field plate 11.

The substrate 1 serves both as a basis for epitaxially growing the buffer 2 and the constituent layers 4 and 5 of the main semiconductor region 3 thereon and, upon completion of these layers, as a mechanical support therefor and all the overlying parts. The substrate 1 is made from silicon for economy in this particular embodiment but could be made from other materials including semiconductors such as silicon carbide, and insulators such as sapphire and ceramics.

The buffer 2 on the major surface $1_a$ of the substrate 1 may be grown in vapor phase by any known or suitable method such as metalorganic chemical vapor deposition (MOCVD) also known as metalorganic vapor phase epitaxy (MOVPE). The buffer 2 may be either mono- or multi-layered. The multilayer option may comprise, for example, a desired number of alternations of an aluminum nitride (AlN) layer and a gallium nitride (GaN) layer. Other semiconducting materials are employable, including nitrides other than AlN and GaN, and Groups III-V compound semiconductors. Being not too closely associated with the operation of the HEMT-type field-effect semiconductor device, however, the buffer 2 is eliminable.

Directly overlying the buffer 2 is the main semiconductor region 3 having a pair of opposite major surfaces 13 and 14. The electron transit layer 4 is exposed at the second major surface 14 and so is contiguous to the buffer 2. The electron supply layer 5 on the other hand provides the first major surface 13. The electron transit layer 4 is made by MOCVD from undoped GaN to a thickness of, say, 0.3-10.0 micrometers. As indicated by the broken line labeled 12, the electron transit layer 4 provides, in combination with the overlying electron supply layer 5 yet to be detailed, the aforesaid 2DEG layer as the channel adjacent the heterojunction between the layers 4 and 5. The electron transit layer 4 may be made from other compound semiconductors notably including the nitride semiconductors that are generally expressed as:

$$Al_aIn_bGa_{1-a-b}N$$

where the subscripts a and b are both numerals that are equal to or greater than zero and less than one.

The electron supply layer 5 of the main semiconductor region 3 is grown by MOCVD on the electron transit layer 4 to a thickness of 10-50 nanometers, preferably 25 nanometers or so, from a semiconducting nitride that is greater in bandgap, and less in lattice constant, than that from which is made the electron transit layer 4. The electron supply layer 5 is made from undoped $Al_{0.3}Ga_{0.7}N$ in this particular embodiment of the invention, but other semiconducting nitrides are adoptable as well, such as those generally defined as:

$$Al_xIn_yGa_{1-x-y}N$$

where the subscript x is a numeral that is greater than zero and less than one, preferably in the range of 0.1 through 0.4 and most desirably 0.3, and the subscript y is a numeral that is equal to or greater than zero and less than one. The electron supply layer 5 may be made from either undoped or n-doped $Al_xIn_yGa_{1-x-y}N$, or other nitride semiconductors, or other compound semiconductors.

The source electrode 6 and drain electrode 7 are positioned with a required spacing from each other on the major surface 13 of the main semiconductor region 3. Defined by a flat bottom 16 and side walls 17, a recess 15 is formed, as by dry etching, in the major surface 13 of the main semiconductor region 3 in a position between the electrodes 6 and 7. The recess 15 has a depth less than the thickness of the electron supply layer 5, leaving part 18 of the electron supply layer between itself and the electron transit layer 4. The remnant 18 of the electron supply layer 5 under the recess 15 is 0-20 nanometers, preferably 2-15 nanometers, most desirably 3-8 nanometers, and, in this particular embodiment, five nanometers, thick.

The provision of the recess 15 is, however, not an essential feature of this invention. This recess will be unnecessary in cases where, as indicated in FIG. 1A, the required depletion zone or hiatus is created in the 2DEG layer 12 without it. In the absence of the recess 15 the p-type metal oxide semiconductor film 10 may be placed upon the flat major surface 13 of the main semiconductor region 3. If the recess 15 is provided at all, its side walls 17 may be either normal, as shown, or at an angle, to the major surface 13 of the main semiconductor region 3.

The insulating film 9 covers the major surface 13 of the main semiconductor region 3 except where the electrodes 6 and 7 and recess 15 are disposed. The insulating film 9 is made from any of the silicon oxides that are generally defined as $SiO_x$ where the subscript x is a numeral in the range of 1-2, preferably two. The insulating film 9 may be fabricated by plasma chemical vapor deposition (CVD) or the like to a thickness of 300-700 nanometers, typically about 500 nm. So made, the insulating film 9 will develop a compressive stress or compressive strain of, say, $4.00 \times 10^9$ dyn/cm$^2$, thereby conducing to the enhancement of the electron density in the 2DEG layer.

More specifically, upon exertion of a compressive stress on the electron supply layer 5 from the overlying insulating film 9, the electron supply layer 5 will react by developing an expansive strain or tensile stress. The piezoelectric depolarization of the electron supply layer 5 will thus be accelerated for a higher electron density of the 2DEG layer 12. The higher electron density of the 2DEG layer 12 is desirable for reduction of the source-drain resistance when the device is on.

The insulating film 9 is not received in the recess 15 but is open to permit this recess to extend therethrough. The inside surfaces 19 of the insulating film 9 defining that opening are at an angle of 5-60 degrees to the major surface 13 of the main semiconductor region 3.

Possibly, the insulating film 9 might be formed by some other method such as sputtering. Plasma CVD is by far the most desirable, however, in consideration of less damage to the crystal structure at the surface 14 of the main semiconductor region, less surface states, and avoidance of current collapse. It is also possible to fabricate the insulating film 9 from silicon nitride or other insulating materials other than silicon oxide.

The p-type metal oxide semiconductor film 10 covers both bottom 16 and sides 17 of the recess 15 in the electron supply layer 5 and is shown as having rims riding onto some neighboring parts of the surface of the insulating film 9. However, the semiconductor film 10 need not be formed to include parts overriding the surface of the insulating film 9. All that is necessary is that the semiconductor film 10 be received in the recess 15 in the electron supply layer 15.

The p-type metal oxide semiconductor film 10 is made from a semiconducting metal oxide having a resistivity higher than that of the electron supply layer 5, to a thickness of 3-1000 nanometers, preferably about 10-500 nanometers. If less than three nanometers thick, the semiconductor film 10 might fail to make the device normally off as required and, if more than about 1000 nanometers thick, might give rise to trouble in turning the device on by voltage application to the gate electrode 8.

For the best results the p-type metal oxide semiconductor film is fabricated by sputtering in an oxygen-containing atmosphere, to a thickness of 200 nanometers or so. Magnetron sputtering of nickel oxide ($NiO_x$ where x is any number, e.g., 1) is particularly recommended. For making the semiconductor film 10 by this particular sputtering method, there may be introduced into the magnetron sputtering apparatus of conventional design an article that has been prepared by growing the main semiconductor region 3 on the substrate 1 via the buffer 2 and further having the insulating film 9 deposited on the main semiconductor region. Then, with the apparatus filled with an oxygen-containing atmosphere (preferably, a mixture of argon and oxygen), nickel oxide may be sputtered onto the article to form the p-type metal oxide semiconductor film 10 to the required thickness. The sputtering of nickel oxide in an oxygen-containing atmosphere is desirable for a high hole concentration in the resulting p-type metal oxide semiconductor film 10.

The subsequent patterning of the p-type metal oxide semiconductor film 10 may be concurrent with that of the gate field plate 11 and gate electrode 8. Alternatively, however, the p-type metal oxide semiconductor film 10 may be patterned independently.

Fabricated as above by the sputtering of nickel oxide in an oxygen-containing atmosphere, the p-type metal oxide semiconductor film 10 is higher in hole concentration than p-doped GaN heretofore used for comparable purposes and is relatively high in resistivity as well. As a consequence, by making the potential sufficiently high under the gate electrode 8, the p-type metal oxide semiconductor film 10 serves to create a gap in the 2DEG layer 12 under the gate electrode 8. There is thus obtained a normally-off heterojunction HEMT-type field-effect semiconductor device. The p-type metal oxide semiconductor film 10 serves the additional purpose of reducing the gate leak current during the operation of the device.

The p-type metal oxide semiconductor film 10 may be made from, instead of nickel oxide, any one or more of iron oxide ($FeO_x$ where x is any numeral, e.g. two), cobalt oxide ($CoO_x$ where x is any numeral, e.g. two), manganese oxide ($MnO_x$ where x is any numeral, e.g. one), and copper oxide ($CuO_x$ where x is any numeral, e.g. one). All such alternate materials may also be fabricated into film form by sputtering in an oxygen-containing atmosphere in order to gain the same advantages as does the film 10 of nickel oxide.

The sputtering of a metal oxide in an oxygen-containing atmosphere is not, however, the sole method of creating the p-type metal oxide semiconductor film 10. Alternatively, a metal film may first be fabricated as by sputtering and oxidized subsequently. Optionally, for enhancing its p-type conductivity, the p-type metal oxide semiconductor film 10 may be subjected to heat treatment, ozone ashing, or oxygen ashing.

The source electrode 6 and drain electrode 7 may both be formed by first depositing titanium on the entire major surface 13 of the main semiconductor region 3 to a thickness of, say, 25 nanometers, then depositing aluminum on the titanium layer to a thickness of, say, 300 nanometers, and then photolithographically patterning the superposed titanium and aluminum layers. The electrodes 6 and 7 may be made from some other metal or combinations of other metals, provided that such a metal or metals are capable of low-resistance (ohmic) contact with the electron supply layer 5 of the main semiconductor region 3. Being so thin, the electron supply layer 5 has a resistance negligibly low in its thickness direction. Therefore, for all practical purposes, the electrodes 6 and 7 are electrically coupled to the two-dimensional electron gas layer 12 via the electron supply layer 5.

The gate electrode 8 is a layer of metal deposited on the p-type metal oxide semiconductor film 10 and so positioned opposite the flat bottom 16 of the recess 15 in the electron supply layer 5 of the main semiconductor region 3 via the film 10. As indicated at FIG. 1B, the gate electrode 8 of this particular embodiment is a lamination of a nickel layer 81 and gold layer 82. The nickel layer 81 is deposited on the p-type metal oxide semiconductor film 10 (made from nickel oxide in this embodiment) to a thickness of 30 nanometers, and the gold layer 82 on the nickel layer 81 to a thickness of 300 nanometers. The illustrated arrangement of the nickel oxide layer 10, nickel layer 81 and gold layer 82 is desirable for reduction of gate leak current. Alternatively, the gate electrode 8 may be either a lamination of nickel, gold and titanium layers, or a single layer of aluminum, or that of electrically conducting polysilicon.

Formed in one piece with the gate electrode 8, the gate field plate 11 is held opposite the electron supply layer 5 via the insulating film 9 and metal oxide semiconductor film 10. As has been mentioned, the inside surfaces 19 of the insulating film 9 defining the opening therein are at an angle of 5-60 degrees to the major surface 13 of the main semiconductor region 3. Consequently, the spacing between electron supply layer 5 and gate field plate 11 widens as they extend away from the gate electrode 8 on the bottom 16 of the recess 15 in the electron supply layer. Thus are mitigated the field concentrations at the edges of the gate electrode 8.

Operation

In the HEMT-type field-effect semiconductor device constructed as hereinbefore described with reference to FIG. 1A, the 2DEG layer 12 has a gap under the gate electrode 8 in the normal state of the device in which no voltage is impressed to the gate. The gap is normally created in the 2DEG layer 12 because the electron supply layer 5 is not sufficiently thick under the gate electrode 8 not just because of the recess 15 but because the p-type metal oxide semiconductor film 10 received therein. The device is therefore normally off, even if the drain electrode 7 is higher in potential than the source electrode 6.

Figure 2:
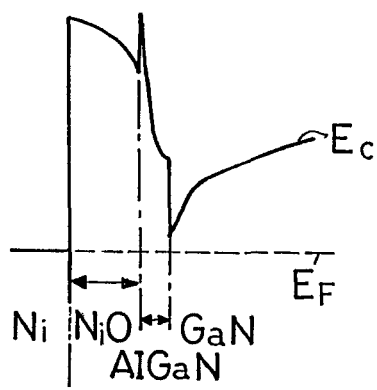
FIGS. 2A to 2C show the energy level diagrams of the normally-off field-effect semiconductor device of FIG. 1A and two prior art Schottky-gate HEMTs.
Figure 2:
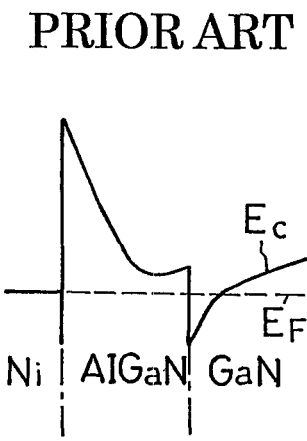
Figure 2:
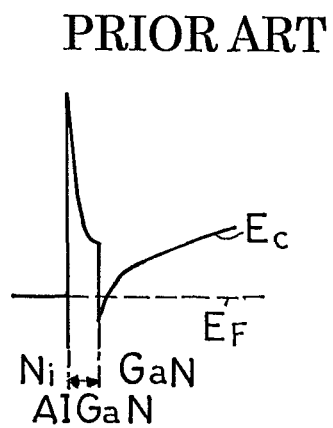

FIG. 2A gives the energy level diagram of the normally-off HEMT-type field-effect semiconductor device of FIG. 1A according to the invention. Also, by way of comparison, there are shown at FIGS. 2B and 2C the energy level diagrams of a prior art Schottky-gate HEMT and another prior art Schottky-gate HEMT which is of the same construction as the device of FIG. 1A except for the absence of the p-type metal oxide semiconductor film 10. The following indicia are used in these energy level diagrams:

$E_F$=Fermi level
$E_C$=boundary level between conduction band and band gap
Ni=gate electrode 8
NiO=p-type metal oxide semiconductor film 10
AlGaN=electron supply layer 5
GaN=electron transit layer 4.

In the device of FIG. 1A according to the invention, the electron supply layer 5 being as thin as five nanometers or less under the gate electrode 8, lattice relaxation takes place there, as it also does at FIG. 2C. The result is a decrease in the charge due to piezoelectric depolarization, as well as in the charge due to spontaneous depolarization because of a less bulk characteristic. These charge decreases in the electron supply layer 5 lead to a lowering of the Fermi level and hence to a relative rise in potential under the gate electrode 8. The potential further rises under the gate electrode 8 as at FIG. 2A by virtue of the p-type metal oxide semiconductor film 10 according to the invention.

Thus does the 2DEG layer 12 disappear from that part of the electron transit layer 4 which underlies the gate electrode 8. The device is therefore normally off. Even though the electron supply layer partly remains at 18 under the recess 15, the depolarization of this remaining part 18 is cancelled out by the p-type metal oxide semiconductor film 10 to prevent the creation of a 2DEG layer under the gate electrode 8.

In order to turn this HEMT-type device on, a positive control voltage higher than a predetermined threshold may be impressed between the source electrode 6 and gate electrode 8, with the drain electrode held higher in potential than the source electrode. A channel will then appear in the electron transit layer 4 under the gate electrode 8 on the same principle as in the known metal oxide semiconductor gate configuration. The application of a positive voltage to the gate electrode 8 will result in the depolarization of the p-type metal oxide semiconductor film 10, which will then collect holes in neighboring part of the electron supply layer 5. Electrons will then be induced in neighboring part of the electron transit layer 4. The channel will thus be created to complete conduction between source electrode 6 and drain electrode 7. There will be a flow of electrons along the path sequentially comprising the source electrode 6, electron supply layer 5, now-closed 2DEG layer 12, electron supply layer 5, and drain electrode 7. As is well known, the electron supply layer 5 is so thin that electrons travel therethrough by virtue of the tunnel effect.

Figure 3:
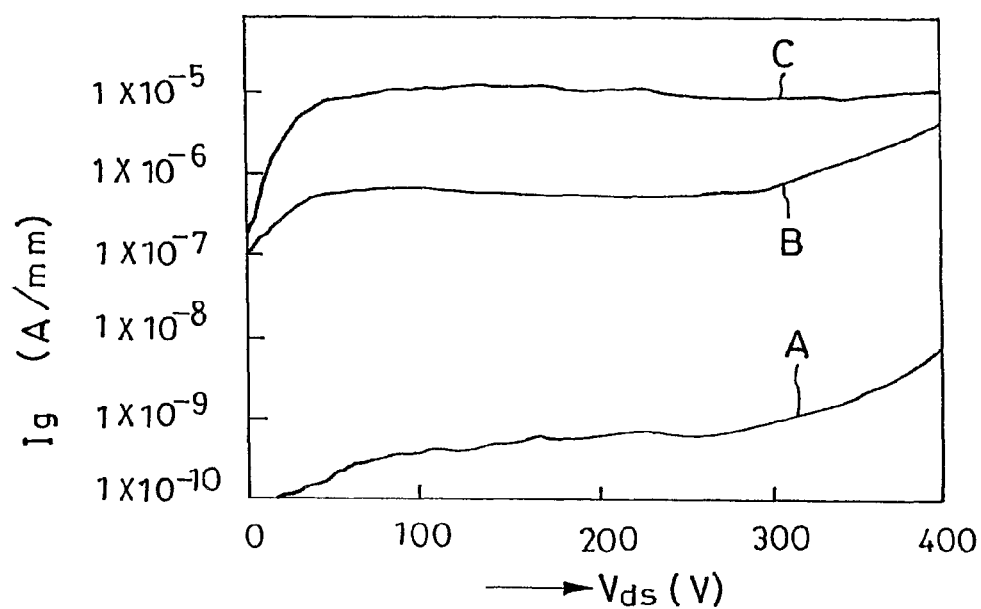
FIG. 3 is a graph plotting the curves of the gate current of the normally-off field-effect semiconductor device of FIG. 1A and the two prior art devices of FIGS. 2B and 2C against the drain-source voltage.

The curve A in the graph of FIG. 3 plots the gate leak current $I_g$ of the normally-off HEMT-type device of FIG. 1A according to the invention against the drain-source voltage $V_{ds}$. The curves B and C in the same graph indicate like relationships as exhibited by the prior art Schottky-gate HEMTs set forth in conjunction with FIG. 2B and FIG. 2C, respectively. By the gate leak current $I_g$ is meant the gate-drain current when the gate-source voltage $V_{gs}$ is zero.

A comparison of the curves A, B and C in FIG. 3 makes it clear how small the gate leak current $I_g$ of the device of this invention is in comparison with those of the prior art devices.

The benefits offered by the HEMT-type field-effect semiconductor device, described hereinbefore in terms of its first preferred form, may be recapitulated as follows:

1. Fabricated by sputtering, magnetron sputtering in particular, in an oxygen-containing atmosphere, the p-type metal oxide semiconductor film 10 is higher in hole concentration than its conventional p-doped GaN counterpart. The p-type metal oxide semiconductor film 10 of high hole concentration plays a vital role in normally creating an interruption in the 2DEG layer in the electron transit layer under the gate by making the potential higher there. A normally-off HEMT-type device is thus obtained which is free from the noted shortcomings of its conventional counterparts.

2. The p-type metal oxide semiconductor film 10 is so high in resistivity, or so insulating, and so thick (e.g., 10-500 nanometers), that the device has less gate leak current and higher antivoltage strength. There is no downward shifting of the threshold if the semiconductor film 10 is made as thick as desired for such purposes. Gate leak current will be reduced to a minimum particularly when the semiconductor film 10 is made from $NiO_x$ and the gate electrode 8 is a lamination of nickel and gold layers as at FIG. 1B.

3. Made from a chemically stable substance in an oxygen-containing atmosphere, the p-type metal oxide semiconductor layer 10 is easy of fabrication.

4. The device is rendered normally off by the combination of the recess 15 in the electron supply layer 5 and the p-type metal oxide semiconductor film 10 received therein, rather than by the recess 15 alone. The electron supply layer 5 can therefore be left under the recess 15 to a thickness of as much as 3-8 nanometers. This relatively thick part 18 of the electron supply layer 5 under the recess 15 serves to lower the turn-on resistance by making the electron density of the electron transit layer 4 higher under the gate electrode 8, and further to augment the maximum allowable current $I_{max}$ of the device.

5. The source-gate and drain-gate distances of the electron supply layer 5 are so long (e.g., 10 nanometers), and the aluminum proportion of the electron supply layer 5 so high (e.g., 0.1 or more), that, despite being normally off, the device has a relatively low turn-on resistance thanks to the relatively high electron density of the 2DEG layer 12. For this reason, too, the maximum allowable current $I_{max}$ of the device is enhanced.

6. Thanks to the action of the compressive stress (e.g., $4.00 \times 10^9$ dyn/cm$^2$) due to the silicon oxide insulating film 9 on the electron supply layer 5, the 2DEG layer 12 has a greater electron population. As a result, the turn-on resistance of the device becomes lower than that of the prior art device having a silicon nitride film on the surface of the main semiconductor region. The insulating film 9 also functions to lower the gate leak current.

7. By virtue of the gate field plate 11, and of the slanting side surfaces 19 of the insulating film 9, the field concentrations at the edges of the gate electrode 8 are effectively alleviated for a higher antivoltage strength of the device.

8. The gate field plate 11 serves the additional purpose of permitting the electrons that have been trapped at the surface states of the main semiconductor region 3 to be drawn therethrough to the gate electrode 8 when a reverse voltage is applied between drain and source, thereby saving the device from current collapse.

9. The p-type metal oxide semiconductor layer 10 is capable of fabrication by magnetron sputtering in an oxygen-containing atmosphere to a sufficient thickness and sufficient hole concentration for the purposes of this invention.

10. The p-type metal oxide semiconductor film 10 may have its p-type conductivity (hole concentration) enhanced by heat treatment, ozone ashing, or oxygen ashing.

Figure 4:
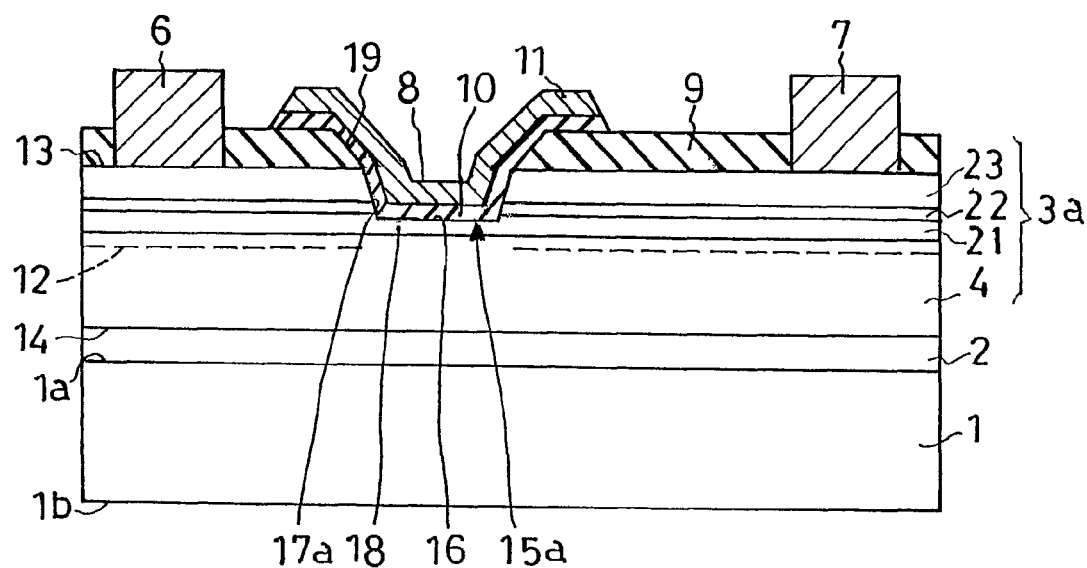
FIG. 4 is a diagrammatic, sectional illustration of another preferred form of normally-off field-effect semiconductor device according to the invention.
Figure 5:
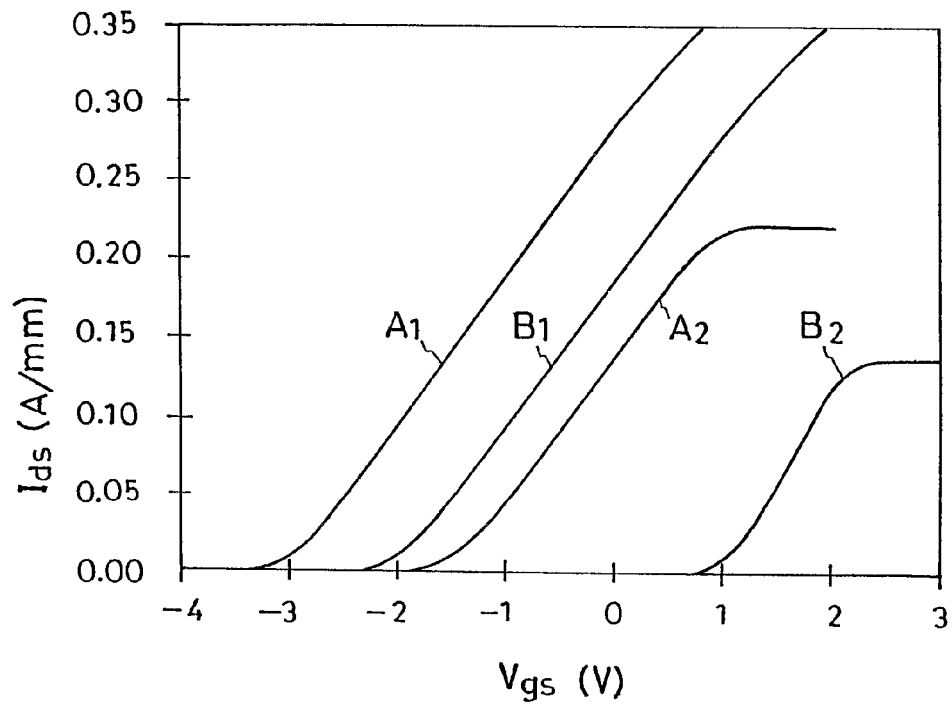
FIG. 5 is a graph plotting the curves of the drain-source current of the normally-off field-effect semiconductor device of FIG. 4 and three different noninventive devices of comparable design against the gate-source voltage.
Figure 6:
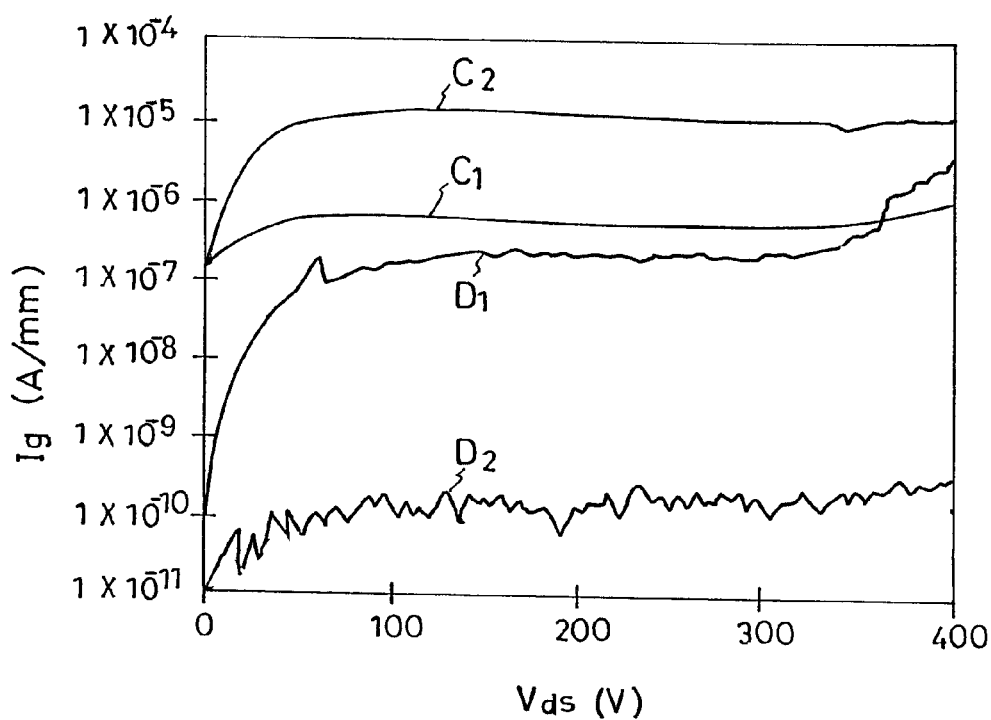
FIG. 6 is a graph plotting the curves of the gate leak current of the normally-off field-effect semiconductor device of FIG. 4 and the three different noninventive devices of comparable design against the drain-source voltage.

Embodiment of FIGS. 4-6

The second preferred form of HEMT-type field-effect semiconductor device has a modified main semiconductor region $3_s$, all the other details of construction being as above described with reference to FIG. 1A. The modified main semiconductor region $3_a$ has three electron supply layers 21, 22 and 23, instead of one in the preceding embodiment, which are successively deposited in that order on the electron transit layer 4. A recess $15_a$ extends from the surface 13 of the main semiconductor region $3_a$ through the second and third electron supply layers 22 and 23 into the first electron supply layer 21, terminating short of the electron transit layer 4. This recess $15_a$ differs from its FIG. 1A counterpart 15 in that the surfaces $17_a$ of the electron supply layers 21-23 bounding that recess $15_a$ are at an angle to the surface 13 of the main semiconductor region $3_a$, instead of being perpendicular thereto as in the FIG. 1A embodiment.

Forming a heterojunction with the electron transit layer 4, the first electron supply layer 21 is made from a nitride semiconductor that is greater in bandgap and less in lattice constant than the electron transit layer 4 and that contains aluminum in a proportion of 0.1-0.3. The first electron supply layer 21 may be 5-10 nanometers thick.

In this particular embodiment the first electron supply layer 21 is made from undoped $Al_{0.26}Ga_{0.74}N$ by MOCVD to a thickness of seven nanometers. The first electron supply layer 21 of this embodiment is therefore less in aluminum proportion, as well as in thickness, than the electron supply layer 5 of the FIG. 1A embodiment. The smaller aluminum proportion of the first electron supply layer 21 serves for raising the threshold voltage of this HEMT-type semiconductor device and for reducing threshold fluctuations arising from fluctuations in the depth of the recess $15_a$ due to manufacturing errors.

Broadly speaking, the first electron supply layer 21 may be made from any of the nitride semiconductors that are generally defined as:

$$Al_xIn_yGa_{1-x-y}N$$

where the subscript x is a numeral that is greater than 0.1 and less than 0.3, and the subscript y is a numeral that is equal to or greater than zero and less than one.

The second electron supply layer 22 is made from an n-type nitride semiconductor that is greater in bandgap, and less in lattice constant, than the electron transit layer 4 and higher in aluminum proportion than the first electron supply layer 21. The thickness of the second electron supply layer 22 may be in the range of 3-25 nanometers, preferably about five nanometers.

The second electron supply layer 22 of this embodiment is made by MOCVD into the composition $Al_{0.34}Ga_{0.66}N$, additionally containing silicon as an n-type dopant. The second electron supply layer 22 is therefore greater in aluminum proportion, and in electron density too, than the first electron supply layer 21. The second electron supply layer 22 is effective to add to the electron density of the 2DEG layer 12 in the electron transit layer 4. Because of the recess 15 extending through the second electron supply layer 22, however, this layer does not adversely affect the desired creation of the hiatus in the 2DEG layer 12.

Broadly, the second electron supply layer 22 may be made from any of the nitride semiconductors of the general formula:

$$Al_xIn_yGa_{1-x-y}N$$

where the subscript x is a numeral that is greater than 0.2 and less than 0.5, and the subscript y is a numeral that is greater than or equal to zero and less than one.

The third electron supply layer 23 is made from an undoped nitride semiconductor that is greater in bandgap, and less in lattice constant, than the electron transit layer 4 and less in aluminum proportion than the second electron supply layer 22. The thickness of the third electron supply layer 23 may be in the range of 10-150 nanometers, preferably about 13 nanometers. Grown by MOCVD, the third electron supply layer 23 is of undoped $Al_{0.30}Ga_{0.70}N$. This aluminum proportion is less than that of the second electron supply layer 22. Undoped and smaller in aluminum proportion, the third electron supply layer 23 serves for surface charge control of the main semiconductor region $3_a$.

Broadly, the third electron supply layer 23 may be made from any of the nitride semiconductors of the general formula:

$$Al_xIn_yGa_{1-x-y}N$$

where the subscript x is a numeral that is greater than or equal to zero and less than 0.4, and the subscript y is a numeral that is greater than or equal to zero and less than one.

The recess 15a extends as aforesaid from the surface 13 of the main semiconductor region $3_a$ through the second and third electron supply layers 22 and 23 into the first electron supply layer 21 and terminates short of the electron transit layer 4, leaving part 18 of the first electron supply layer thereunder. Alternatively, however, the recess $15_a$ may not extend into the first electron supply layer 21. In either case the recess $15_a$ may have its depth so determined that the 2DEG layer 12 would have no gap normally created under the gate electrode 8 in the absence of the p-type metal oxide semiconductor film 10 but will do have a gap existing under the gate electrode in the presence of the p-type metal oxide semiconductor film as shown.

The recess $15_a$ tapers as it extends downwardly from the surface 13 of the main semiconductor region $3_a$, with its side walls $17_a$ at an angle of 15-80 degrees to that surface, which in this figure is shown to be greater than the angle (5-60 degrees) of the inside surfaces 19 of the insulating film 9 defining the opening therein. However, the side walls $17_a$ of the recess $15_a$ could be normal to the surface 13, like the side walls 17 of the recess 15 in FIG. 1A. The p-type metal oxide semiconductor film 10 is so high in resistance that the placement of the field plate 11 opposite the main semiconductor region $3_a$ via the semiconductor film 10 is effective for mitigation of field concentrations, much like the placement of the field plate 11 opposite the main semiconductor region 11 via the insulating film 9. The mitigation of field concentrations by the field plate 11 becomes even more effective as the second electron supply layer 22 of relatively high electron density is exposed at the side walls $17_a$ of the recess $15_a$.

FIG. 5 plots the curves of the drain-source current $I_{ds}$ against the gate-source voltage $V_{gs}$ as exhibited by the device of FIG. 4 and, by way of comparison, by three devices similar to the FIG. 4 device. The four curves of FIG. 5 represent the following devices:

Curve $A_1$:
First noninventive device constructed as in FIG. 4 except for the absence of the recess $15_a$ and p-type metal oxide semiconductor film 10 and having a gate electrode of laminated nickel and gold layers on the surface 13 of the main semiconductor region 3.

Curve $A_2$:
Second noninventive device constructed as in FIG. 4 except for the absence of the p-type metal oxide semiconductor film 10 and having a gate electrode of laminated nickel and gold layers received directly in the recess 15$_a$.

Curve B$_1$:

Third device constructed as in FIG. 4 except for the absence of the recess 15$_a$ but having a p-type metal oxide semiconductor film 10 of NiO$_x$ with a thickness of 200 nanometers and a gate electrode of laminated nickel and gold layers on the p-type metal oxide semiconductor film 10.

Curve B$_2$:

Device of this invention constructed as in FIG. 4, which in other words is similar to the third device plus the recess 15$_a$ and field plate 11.

It will be observed from FIG. 5 that the first, second and third devices (curves A$_1$, A$_2$ and B$_1$) have all negative threshold voltages. Only the device according to the invention (curve B$_2$) has a positive threshold voltage. Thus the device of FIG. 4 provides a normally-off HEMT-type field-effect semiconductor device.

In FIG. 6 are given curves of the gate leak current I$_g$ (i.e., gate-drain current when the gate-source voltage V$_{gs}$ is zero) against the drain-source voltage V$_{ds}$ as exhibited by the following devices:

Curve C$_1$:

First noninventive device above.

Curve C$_2$:

Second noninventive device above.

Curve D$_1$:

Third device above minus the field plate 11.

Curve D$_2$:

Inventive device of FIG. 4.

The gate leak current I$_g$ of the device according to the invention (curve D$_2$) is much less than those of the first, second and third devices (C$_1$, C$_2$ and D$_1$). It is submitted that this low gate leak current is attributable to nothing but the combination of the field plate 11 and the high-resistivity p-type metal oxide semiconductor film 10 received in the recess 15$_a$.

The embodiment of FIG. 4 offers the following advantages in addition to all those enumerated in conjunction with that of FIG. 1A:

1. A positive threshold voltage is infallibly obtained thanks to the first electron supply layer 21 of a low aluminum proportion disposed next to the electron transit layer 4.

2. Higher in both aluminum proportion and electron density than the underlying first electron supply layer 21, the second electron supply layer 22 is effective to make the 2DEG layer 12 higher in electron density at other than under the recess 15$_a$ in the main semiconductor region 3$_a$ and hence to lower the turn-on resistance of the device. Should the second and third electron supply layers 22 and 23 be absent from this device, leaving only the first electron supply layer 21 which was less in aluminum proportion than the electron supply layer 5 of the FIG. 1A device, then the 2DEG layer 12 would be less in electron density than its FIG. 1A counterpart. This undesired drop in the electron density of the 2DEG layer 12 is precluded by placing on the first electron supply layer 21 the second electron supply layer 22 which is higher in both aluminum proportion and electron density than the first. Actually, the turn-on resistance of this embodiment is just as low as, or even less than, that of the FIG. 1A embodiment. The provision of the second electron supply layer 22 does not run counter to the creation of the hiatus in the 2DEG layer 12 since the recess 15$_a$ extends through that layer 22.

3. With the recess 15$_a$ extending into the first electron supply layer 21 of a less aluminum proportion, less fluctuations would occur in threshold voltage from manufacturing errors in the depth of the recess 15$_a$. If the part 18 of the first electron supply layer 21 underlying the recess 15$_a$ were higher in aluminum proportion and electron density, the threshold voltage of the device would fluctuate greatly depending upon variations in the thickness of that first electron supply layer part 18. No such inconvenience is to occur with this embodiment because the part 18 is less in aluminum proportion than the corresponding part 18 in the FIG. 1A embodiment.

4. Field concentrations adjacent the gate electrode 8 are lessened as the second electron supply layer 22 of relatively high electron density is exposed edgewise at the slanting side walls 17$_a$ of the recess 15$_a$. The field plate 11, covering the slanting side walls 17$_a$ of the recess 15$_a$ via the p-type metal oxide semiconductor film 10 which is so high in resistivity that it might be called an insulator, performs its function even in the neighborhoods of the slanting side walls 17$_a$. The result is an even more alleviation of field concentrations in the adjacency of the gate electrode 8, enabling the device to withstand higher voltages than heretofore.

5. Less in aluminum proportion than the second electron supply layer 22, the third electron supply layer 23 functions to electrically stabilize the major surface 13 of the main semiconductor region 3$_a$, saving the device from current leakage and current collapse.

Figure 7:
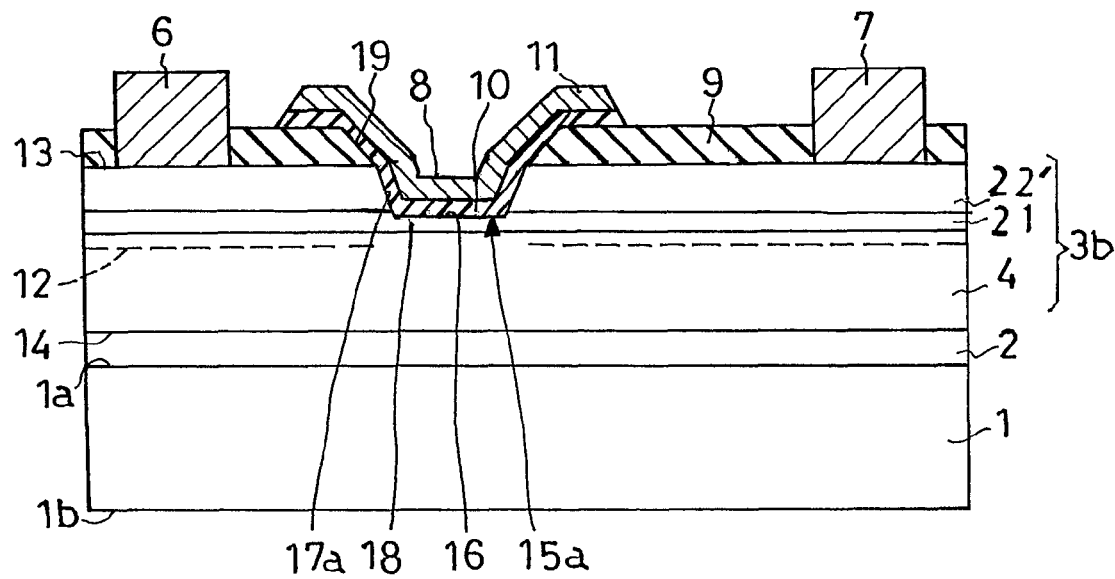
FIG. 7 is a diagrammatic, sectional illustration of yet another preferred form of normally-off field-effect semiconductor device according to the invention.

Embodiment of FIG. 7

This embodiment is akin to that of FIG. 4 except for the main semiconductor region 3$_b$. This main semiconductor region 3$_b$, then, is similar to its FIG. 4 counterpart 3$_a$ except for the absence of the third electron supply layer 23, having the remaining two electron supply layers 21 and 22' deposited one after the other on the electron transit layer 4. The first electron supply layer 21 is of the same make as that indicated by the same numeral in FIG. 4. The second electron supply layer 22' is the same as its FIG. 4 counterpart except being thicker, being 10-150 nanometers, preferably about 18 nanometers, thick.

Having the two electron supply layers 21 and 22' of the same compositions as their FIG. 4 counterparts 21 and 22, this embodiment possesses the same benefits as does that of FIG. 4 except those accruing from the third electron supply layer 23. The material of the second electron supply layer 22' is alterable into a semiconducting nitride not doped with silicon or other n-type impurity. The undoped semiconducting nitride layer will function like the familiar cap layer intended primarily for surface charge control.

Figure 8:
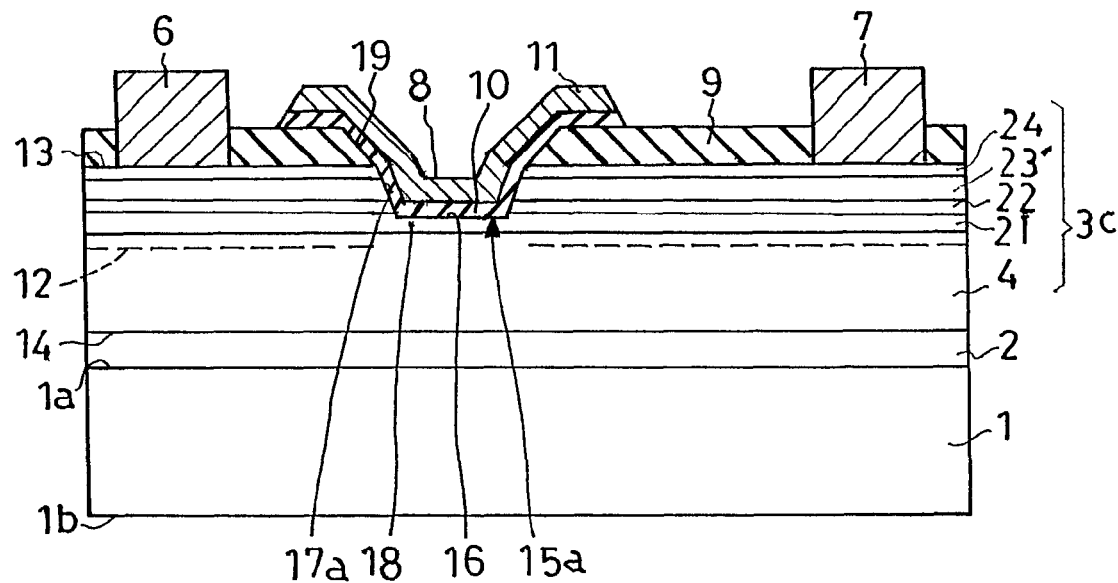
FIG. 8 is a diagrammatic, sectional illustration of still another preferred form of normally-off field-effect semiconductor device according to the invention.

Embodiment of FIG. 8

Here is presented another modification of the FIG. 4 embodiment, featuring a main semiconductor region 3$_c$ of the same design as its FIG. 4 counterpart 3$_a$ except for the third electron supply layer 23' and a fourth electron supply layer 24. The third electron supply layer 23' of the modified main semiconductor region 3$_c$ is thinner than its FIG. 4 counterpart 23, being 5-140 nanometers, preferably about 13 nanometers, thick. For better ohmic contact with the overlying electrodes 6 and 7, the fourth electron supply layer 24 is made from an n-type semiconducting nitride that is either less in aluminum proportion than the third electron supply layer 23' or does not contain aluminum at all. A preferred example is GaN doped with silicon into n-type conductivity. The fourth electron supply layer 24 may be 3-100 nanometers, preferably about 13 nanometers, thick. Aside from an n-type dopant, other semiconducting nitrides employable for the fourth electron supply layer 24 are generally defined as:

$$Al_x In_y Ga_{1-x-y} N$$

where the subscript x is a numeral that is greater than or equal to zero and less than 0.4, and the subscript y is a numeral that is greater than or equal to zero and less than one.

Having the fourth electron supply layer 24 of silicon-doped GaN, the main semiconductor region 3$_c$ of this embodiment makes better ohmic contact with the source electrode 6 and drain electrode 7. Other advantages are as set forth above in connection with FIG. 4. The fourth electron supply layer 24 does not interfere with the normally-off performance of the device as the recess 15$_a$ extends therethrough.

Figure 9:
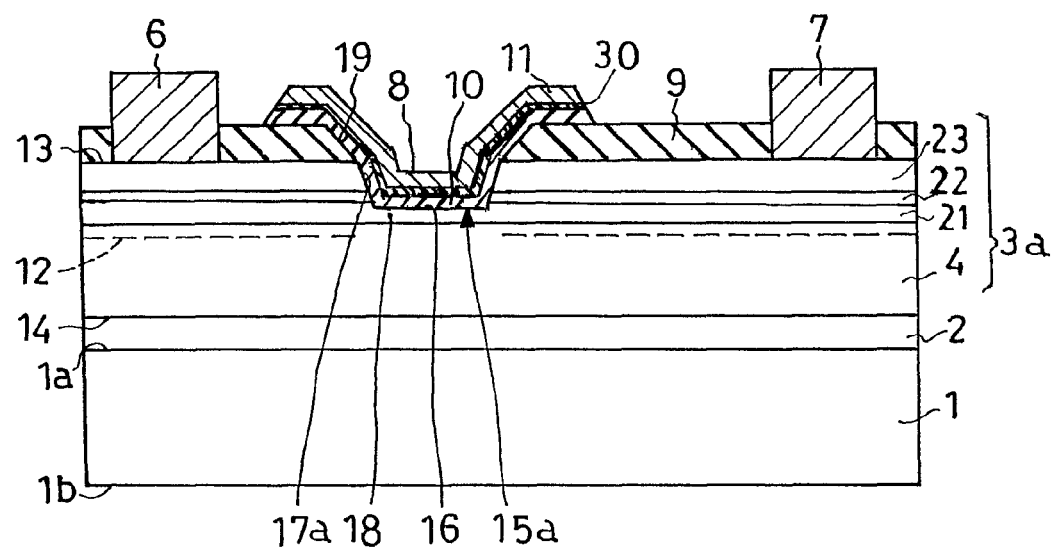
FIG. 9 is a diagrammatic, sectional illustration of a further preferred form of normally-off field-effect semiconductor device according to the invention.

Embodiment of FIG. 9

A second insulating film 30, in addition to the first such film 9, is here employed, all the other details of construction being as described above with reference to FIG. 4. Made from a metal oxide or silicon oxide, the second insulating film 30 is interposed between the p-type metal oxide semiconductor film 10 and the gate electrode 8 and field plate It for reduction of gate leak current. The second insulating film 10 should be only so thick that the gate electrode 8 can act on the electron transit layer 4. The other advantages of this embodiment are as above stated in conjunction with FIG. 4. The second insulating film 30 could be used in the embodiments of FIGS. 1A, 7 and 8 as well.

Figure 10:
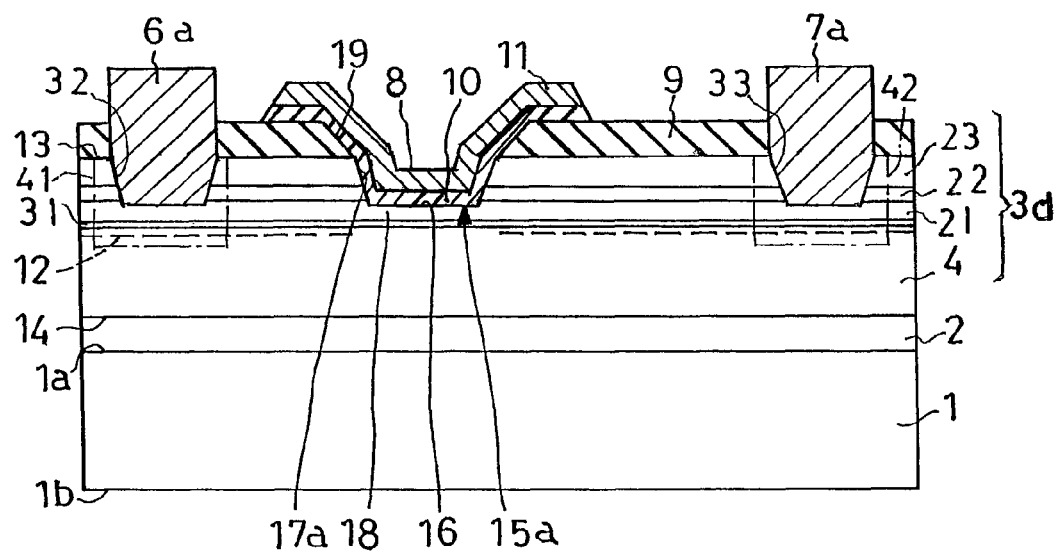
FIG. 10 is a diagrammatic, sectional illustration of a further preferred form of normally-off field-effect semiconductor device according to the invention.

Embodiment of FIG. 10

This embodiment features a modified main semiconductor region 3$_d$, source electrode 6$_a$, and drain electrode 7$_a$ and is otherwise identical with that of FIG. 4. The modified main semiconductor region 3$_d$ is similar to its FIG. 4 counterpart 3$_a$ except that, as is well known in the art, a spacer 31 is interposed between electron transit layer 4 and first electron supply layer 21 and that recesses are formed at 32 and 33 to receive parts of a source electrode 6$_a$ and drain electrode 7$_a$.

Deposited on the electron transit layer 4 to a thickness less than that of the overlying first electron supply layer 21, the spacer 31 conventionally serves to prevent the transfer of the impurities or elements from the electron supply layers 21-23 into the electron transit layer 4 and hence to keep the 2DEG layer 12 from a drop in electron mobility.

Like the recess 15$_a$ receiving the gate electrode 8, the recesses 32 and 33 for the source and drain electrodes 6$_a$ and 7$_a$ extend downwardly from the major surface 13 of the main semiconductor region 3$_d$ through the second and third electron supply layers 22 and 23 into the first electron supply layer 21. Received in part in these recesses 32 and 33, the source and drain electrodes 6$_a$ and 7$_a$ are electrically coupled to the 2DEG layer 12. There are therefore less electrical resistances between the 2DEG layer 12 and the source and drain electrodes 6$_a$ and 7$_a$ than in the device of FIG. 4. The other advantages are as set forth above with reference to FIG. 4.

As a modification of this FIG. 10 embodiment, the recesses 32 and 33 for the electrodes 6$_a$ and 7$_a$ may extend further down to the electron transit layer 4. Also, as indicated by the phantom outlines in FIG. 10, a source contact region 41 and drain contact region 42 may be formed under the electrodes 6$_a$ and 7$_a$ by injection of n-type impurities for ohmic contact with these electrodes. All these teachings and suggested modifications of the FIG. 10 embodiment may be incorporated in the foregoing HEMT-type semiconductor devices of FIGS. 1A, 4 and 7-9, either individually or in combinations of any two or more.

Figure 11:
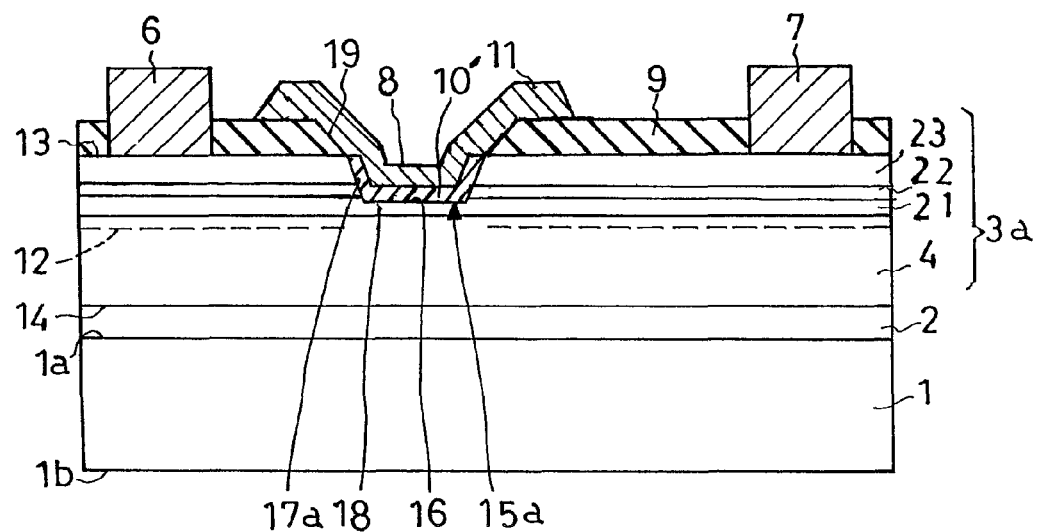
FIG. 11 is a diagrammatic, sectional illustration of a further preferred form of normally-off field-effect semiconductor device according to the invention.

Embodiment of FIG. 11

A modified p-type metal oxide semiconductor layer 10' is employed here, all the other details of construction of this FIG. 11 embodiment being as above stated in connection with that of FIG. 4. The p-type metal oxide semiconductor layer 10' is received wholly in the recess 15$_a$ and does not extend onto the insulating film 9. The field plate 11 is therefore in direct contact with the insulating film 9 and so is bound for more positive fulfillment of its function. The other advantages of this embodiment are as previously described with reference to FIG. 4. The p-type metal oxide semiconductor layer 10' could be used in the devices of FIGS. 1A and 7-10.

Figure 12:
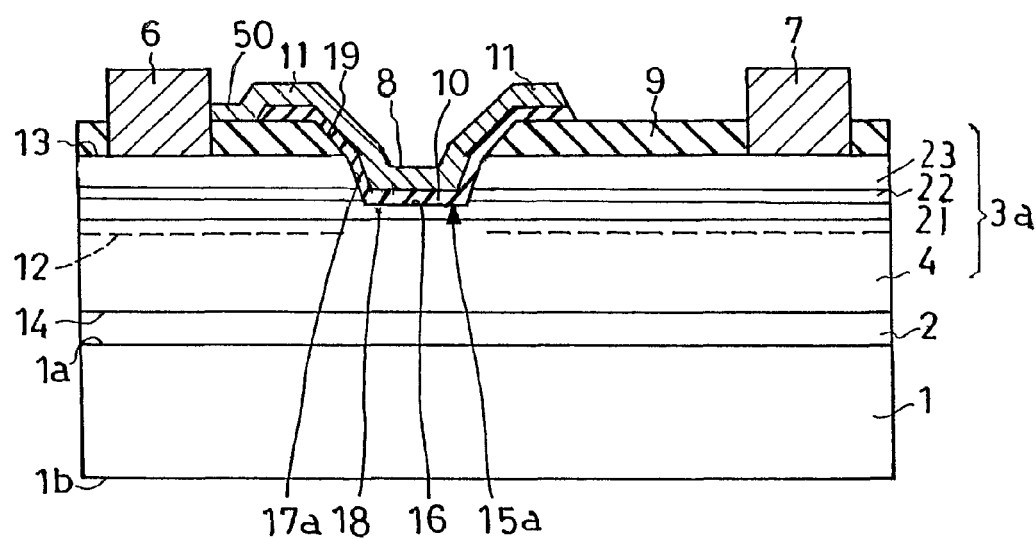
FIG. 12 is a diagrammatic, sectional illustration of a further preferred form of normally-off field-effect semiconductor device as adapted for use as a 2DEG diode according to the invention.

Embodiment of FIG. 12

This HEMT-type semiconductor device operates diode-like by incorporating a conductor 50 electrically interconnecting the source electrode 6 and gate electrode 8. Formed on the insulating film 9, the conductor 6 has one end connected to the source electrode 6 and another end connected to the gate electrode 8 via the field plate 11. The conductor 50 is shown to be integral with the gate electrode 8 and field plate 11, although it could be a discrete member, possibly made from a different metal and electrically coupled to the required parts. The other details of construction are the same as those of the FIG. 4 device.

With the source and gate electrodes 6 and 8 short-circuited by the conductor 12, the device operates as a high speed diode. Were it not for the conductor 12, the device would be a normally-off HEMT-type field-effect semiconductor device like all the foregoing devices. With the source and gate electrodes 6 and 8 short-circuited as in this embodiment, and when the drain electrode 7 is higher in potential than the source electrode 6, the gate electrode will of course be equal in potential to the source electrode and lower than the electron transit layer 4. Electrons will then be driven away from that part of the electron transit layer 4 which is opposed to the gate electrode 8, creating a hiatus in the 2DEG layer 12 and thereby making the device off.

Conversely, when the source electrode 6 grows higher in potential than the drain electrode 7, the potential of the gate electrode 8, being equal to that of the source electrode, will become higher than that of the drain electrode 7 and of the electron transit layer 4. The hiatus in the 2DEG layer 12 will be filled up when the voltage between the electron transit layer 4 and gate electrode 8 builds up beyond the threshold. The device will thus turn on. The foregoing operation of the HEMT-type field-effect semiconductor device of FIG. 12 is that of a diode.

The conductor 50 in one piece with the gate electrode 8 and field plate 11 is not the sole means of making the HEMT-type device of this invention operate diode-like. The same purpose may be accomplished by a separate conductor or by an external switching circuit. Being identical in construction with the device of FIG. 4 except for the conductor 50, this embodiment possesses the same advantages therewith. The conductor 50, or any equivalent thereof, could be built into the devices of FIGS. 1A and 7-11 as well.

Figure 13:
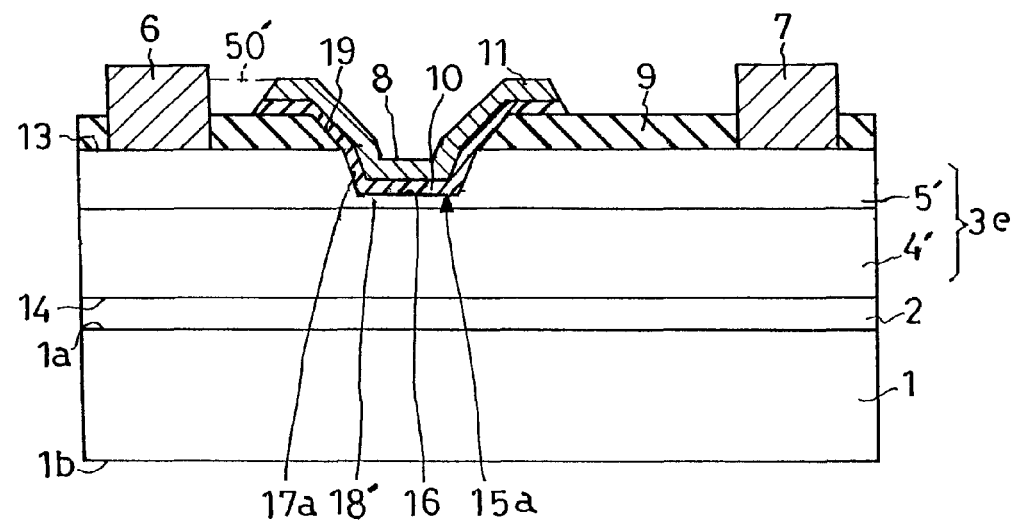
FIG. 13 is a diagrammatic, sectional illustration of a normally-off MESFET-type field-effect semiconductor device according to the invention.

Embodiment of FIG. 13

Here is shown a normally-off field-effect semiconductor device similar to a MESFET. The normally-off MESFET-type device is of the same make as the embodiment of FIG. 4 except for a main semiconductor region 3$_e$ which consists of two semiconductor layers 4' and 5'. The first semiconductor layer 4' is of the same composition as the electron transit layer 4 of the main semiconductor region $3_a$ in FIG. 4. The second semiconductor layer 5' is of the same composition as, for example, the second electron supply layer 22 of the main semiconductor region $3_a$ in FIG. 4 and is doped with an n-type impurity such as silicon. The second semiconductor layer 5' provides the channel between source electrode 6 and drain electrode 7.

In order to make the device normally off, the recess $15_a$ extends from the major surface 13 of the main semiconductor region $3_a$ through the second semiconductor layer 5' and terminates short of the first semiconductor layer 4', leaving part 18' of the second semiconductor layer 5' thereunder. The depth of the recess $15_a$, or the thickness of the underlying part 18' of the second semiconductor layer 5', is so determined that the part 18' is normally depleted of electrons with the aid of the overlying p-type metal oxide semiconductor film 10.

The operation of this MESFET-type device is similar to that of the junction-type FET. The drain current flows from drain electrode 7 to source electrode 6 through the second semiconductor layer 5' upon application of a voltage higher than the threshold between source electrode 6 and gate electrode 8 while the drain electrode 7 is higher in potential than the source electrode 6.

The benefits of the normally-off MESFET-type device include:

1. The device is positively maintained normally off by the action of the p-type metal oxide semiconductor layer 10.

2. The part 18' of the second semiconductor layer 5' remaining under the gate electrode 8 can be sufficiently thick to avoid power loss there.

3. The field plate 11 is just as effective as in the embodiments of FIGS. 1A and 4.

The normally-off MESFET-type device of this embodiment could additionally incorporate any one or more of the insulating film 30, FIG. 9, the recesses 32 and 33, FIG. 10, the modified metal oxide semiconductor film 10', FIG. 11, and the diode-forming conductor 50', FIG. 13.

Figure 14:
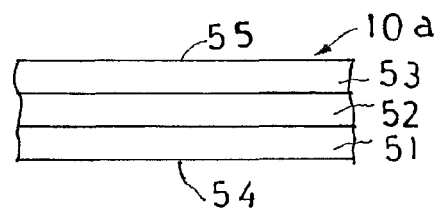
FIG. 14 is a fragmentary, diagrammatic illustration of a modified p-type metal oxide semiconductor film according to the invention.

Embodiment of FIG. 14

A modification $10_a$ of the p-type metal oxide semiconductor film 10 of the FIG. 1A embodiment is shown here. The modified p-type metal oxide semiconductor film $10_a$ is a lamination of a nickel oxide layer 51, iron oxide layer 52, and cobalt oxide layer 53, arranged in that order from bottom to top. It is understood that the bottom surface 54 of the semiconductor layer $10_a$ is contiguous to the electron supply layer of the main semiconductor region, and the top surface 55 to the gate electrode 8. Preferably, the lowermost nickel oxide layer 51 should be the highest, and the topmost cobalt oxide layer 53 the lowest, in hole density.

Made up from layers of dissimilar p-type metal oxide semiconductors, the semiconductor film $10_a$ is as effective as its monolayered version for the purposes of this invention stated above. This multilayer semiconductor film $10_a$ is substitutable for its counterparts 10 or 10' in all the other embodiments of the invention disclosed herein. The constituent layers 51-53 may each be the oxide of any such metal as nickel, iron, cobalt, manganese and copper. It is also possible to delete one, 53 for example, of the layers 51-53 or to add one or more other layers.

Figure 15:
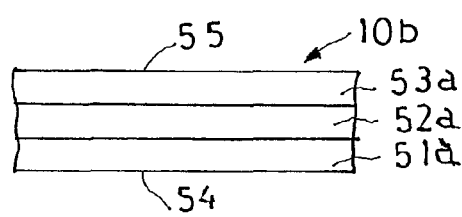
FIG. 15 is a fragmentary, diagrammatic illustration of another modified p-type metal oxide semiconductor film according to the invention.

Embodiment of FIG. 15

Another modification $10_b$ of the p-type metal oxide semiconductor film 10 in the embodiment of FIG. 1 consists of a lamination of three layers $51_a$, $52_a$ and $53_a$ which progressively lower in hole density from the lowermost one $51_a$ upward. The lowermost layer $51_a$ of the highest hole density contacts the electron supply layer of the main semiconductor region whereas the uppermost layer $53_a$ of the lowest hole density contacts the gate electrode.

Magnetron sputtering is here again a preferable method of creating the triple-layered p-type metal oxide semiconductor film $10_b$. While a metal oxide such as nickel oxide is being sputtered, oxygen may be added in progressively less quantities.

With the lowermost layer $51_a$ of the highest hole density placed in contact with the electron supply layer, the p-type metal oxide semiconductor film $10_b$ is conducive to the normally-off performance of the device. It also has the same benefits as does the semiconductor film 10 of the FIG. 1A embodiment and so is substitutable for that designated 10 or 10' in the other embodiments of the invention. It is also possible to delete one, $53_a$ for example, of the layers $51_a$-$53_a$ or to add one or more other layers thereto.

It is further envisaged within the scope of the invention to infinitely, rather than in discrete steps, decrease the hole density from bottom 54 to top 55 of the p-type metal oxide semiconductor film. To this end the amount of oxygen or the like being added may be continually diminished during, for example, the magnetron sputtering of nickel oxide. As an alternative method of varying the hole density of the p-type metal oxide semiconductor film in its thickness direction, the conditions of the heating, ozone ashing, or oxygen ashing of the film may be varied with the progress of film growth. Another possible alternative method is lithium doping in decreasing quantities at the same time with film growth.

Possible Modifications

Notwithstanding the foregoing detailed disclosure it is not desired that the present invention be limited by the exact showings of the drawings or the description thereof. The following is a brief list of possible modifications, alterations or adaptations of the illustrated representative normally-off HEMT-type field-effect semiconductor devices and methods of their fabrication which are all believed to fall within the purview of the claims annexed hereto:

1. The main semiconductor regions 3 and $3_a$-$3_c$ of the illustrated embodiments could made from compound semiconductors other than GaN and AlGaN, such as other Groups III-V compound semiconductors including InGaN, AlInGaN, AlN, InAlN, AlP, GaP, AlInP, GaInP, AlGaP, AlGaAs, GaAs, AlAs, InAs, InP, InN, and GaAsP, and Groups II-VI compound semiconductors including ZnO.

2. The known source field plate and drain field plate could be incorporated.

3. A desired number of field-effect semiconductor devices, each constructed as like any of the illustrated embodiments, may be built into one chip in parallel connection with one another.

4. The electron supply layer of the main semiconductor region in the illustrated embodiments is replaceable by a hole supply layer, in which case a two-dimensional hole gas (2DHG) layer will appear in lieu of the 2DEG layer. Also, in this case, the p-type metal oxide semiconductor film of the various embodiments may be replaced by an n-type metal oxide semiconductor film. In the FIG. 13 embodiment a p-type semiconductor layer may be substituted for the n-type semiconductor layer 5' of the main semiconductor region $3_e$, and an n-type metal oxide semiconductor film may be disposed on the p-type semiconductor layer.

5. Lithium, rather than oxygen, may be added for obtaining the p-type metal oxide semiconductor film.

What is claimed is:

1. A field-effect semiconductor device comprising:
   (a) a main semiconductor region having a first semiconductor layer and a second semiconductor layer placed on the first semiconductor layer, the second semiconductor layer being greater in bandgap than the first semiconductor layer, the first semiconductor layer having a two-dimensional carrier as layer of a first conductivity type, the main semiconductor region having a first and a second opposite major surface, the second semiconductor layer being disposed between the first major surface of the main semiconductor region and the first semiconductor layer;
   (b) a first and a second main electrode disposed in spaced-apart positions on the first major surface of the main semiconductor region and electrically coupled to the two-dimensional carrier gas layer in the first semiconductor layer of the main semiconductor region;
   (c) a gate electrode disposed between, and spaced from, the first and the second main electrode on the first major surface of the main semiconductor region for controlling conduction between the first and the second main electrode via the two-dimensional carrier gas layer; and
   (d) a metal oxide semiconductor film disposed between the gate electrode and the main semiconductor region, and having a second conductivity type opposite to the first conductivity type.

2. A field-effect semiconductor device as defined in claim 1, wherein the main semiconductor region has formed therein a recess extending from the first major surface of the semiconductor region and terminating short of the first semiconductor layer, and wherein the gate electrode is received in the recess via the metal oxide semiconductor film.

3. A field-effect semiconductor device as defined in claim 2, wherein the second semiconductor layer has part underlying the recess therein, and wherein the underlying part of the second semiconductor layer is so thick that the two-dimensional carrier gas layer is formed without the depletion zone in the absence of the metal oxide semiconductor film, and that the two-dimensional carrier gas layer has the depletion zone formed therein in the presence of the metal oxide semiconductor film.

4. A field-effect semiconductor device as defined in claim 2, wherein the main semiconductor region further comprises a third semiconductor layer on the second semiconductor layer, the third semiconductor layer being higher in carrier density than the second semiconductor layer, and wherein the recess is formed in at least part of the third semiconductor layer of the main semiconductor region.

5. A field-effect semiconductor device as defined in claim 4, wherein the first semiconductor layer of the main semiconductor region is of a nitride semiconductor, wherein the second semiconductor layer of the main semiconductor region is of a nitride semiconductor containing aluminum, and wherein the third semiconductor layer of the main semiconductor region is of a nitride semiconductor containing a greater proportion of aluminum than the second semiconductor layer.

6. A field-effect semiconductor device as defined in claim 5, wherein the main semiconductor region further comprises a fourth semiconductor layer on the third semiconductor layer, the fourth semiconductor layer being of a nitride semiconductor having an aluminum proportion less than that of the third semiconductor layer, and wherein the recess is formed at least in the third and the fourth semiconductor layer.

7. A field-effect semiconductor device as defined in claim 4, wherein the main semiconductor region further comprises a fourth semiconductor region on the third semiconductor layer, the fourth semiconductor layer being of a nitride semiconductor having an aluminum proportion less than that of the third semiconductor layer, and a fifth semiconductor layer on the fourth semiconductor layer, the fifth semiconductor layer being of a nitride semiconductor having an aluminum proportion less than that of the fourth semiconductor layer and containing a dopant that determines a conductivity type opposite to that of the metal oxide semiconductor film, and wherein the recess is formed at least in the third and the fourth and the fifth semiconductor layer.

8. A field-effect semiconductor device as defined in claim 1, wherein the main semiconductor region has a two-dimensional electron gas layer generated therein, and wherein the metal oxide semiconductor film is of p-type.

9. A field-effect semiconductor device as defined in claim 8, wherein the p-type metal oxide semiconductor film is made from at least one metal oxide selected from the group consisting of nickel oxide, iron oxide, cobalt oxide, manganese oxide, and copper oxide.

10. A field-effect semiconductor device as defined in claim 8, wherein the p-type metal oxide semiconductor film is of nickel oxide, and wherein the gate electrode is a lamination of a nickel layer and a gold layer, with the nickel layer being contiguous to the p-type metal oxide semiconductor layer.

11. A field-effect semiconductor device as defined in claim 8, wherein the p-type metal oxide semiconductor film is a lamination of a plurality of layers of dissimilar p-type metal oxide semiconductors.

12. A field-effect semiconductor device as defined in claim 8, wherein the p-type meal oxide semiconductor film varies in hole density in a direction normal to the first major surface of the main semiconductor region.

13. A field-effect semiconductor device as defined in claim 1, wherein the main semiconductor region further comprises a spacer between the first and the second semiconductor layer, the spacer being thinner than the second semiconductor layer and containing aluminum in a higher proportion than the second semiconductor layer.

14. A field-effect semiconductor device as defined in claim 1, further comprising an insulating film covering at least parts of the first major surface of the main semiconductor region between the first main electrode and the gate electrode and between the second main electrode and the gate electrode.

15. A field-effect semiconductor device as defined in claim 14, further comprising a field plate disposed on the first major surface of the main semiconductor region via the insulating film and coupled to the gate electrode.

16. A field-effect semiconductor device as defined in claim 15, wherein the insulating film has slanting side surfaces underlying the field plate.

17. A field-effect semiconductor device as defined in claim 1, wherein the gate electrode is electrically coupled to the first main electrode whereby the device is adapted for diode-like operation.

18. A field-effect semiconductor device comprising:
   a main semiconductor region having a first semiconductor layer and a second semiconductor layer placed on the first semiconductor layer, the second semiconductor being greater in bandgap than the first semiconductor layer, the first semiconductor layer having a two-dimensional carrier as layer, the main semiconductor region having a first and a second semiconductor layer being disposed between the first major surface of the main semiconductor region and the first semiconductor layer;

a first and a second main electrode disposed in spaced-apart positions on the first major surface of the main semiconductor region and electrically coupled to the two-dimensional carrier as layer in the first semiconductor layer of the main semiconductor region;

a gate electrode disposed between, and spaced from, the first and the second main electrode on the first major surface of the main semiconductor region for controlling conduction between the first and the second main electrode via the two-dimensional carrier gas layer; and (d) a metal oxide semiconductor film disposed between the gate electrode and the main semiconductor region, wherein the metal oxide semiconductor film is made from at least one metal oxide selected from the group consisting of nickel oxide, iron oxide, cobalt oxide, manganese oxide, and copper oxide.

* * * * *